US006966109B2

(12) United States Patent
Puskar et al.

(10) Patent No.: US 6,966,109 B2
(45) Date of Patent: Nov. 22, 2005

(54) METHOD FOR ATTACHING AND FOR ENSURING ORIENTATION OF COMPONENTS

(75) Inventors: Michael P. Puskar, Carnegie, PA (US); Thomas A. Whitaker, North Huntingdon, PA (US); William M. Randal, Baldwin Township, PA (US); Roger W. Helms, Beaver Falls, PA (US)

(73) Assignee: Eaton Corporation, Cleveland, OH (US)

( * ) Notice: Subject to any disclaimer, the term of this patent is extended or adjusted under 35 U.S.C. 154(b) by 154 days.

(21) Appl. No.: 10/631,076

(22) Filed: Jul. 31, 2003

(65) Prior Publication Data

US 2005/0022377 A1 Feb. 3, 2005

(51) Int. Cl.[7] .................................................. H05K 3/30
(52) U.S. Cl. ............................ 29/838; 29/509; 29/557; 29/837; 29/890.414
(58) Field of Search .......................... 29/838, 837, 557, 29/509, 890.144; 285/256, 258, 259; 188/73.37, 188/73.32–73.38, 73.2

(56) References Cited

U.S. PATENT DOCUMENTS 3,875,829 A 4/1975 Evans et al. .................. 81/185
5,695,704 A 12/1997 Sugiura et al. ............. 264/249
6,170,618 B1 1/2001 Rueckert ................. 188/73.37
6,189,199 B1 2/2001 Ouchi et al. .................. 29/557

OTHER PUBLICATIONS

BALTEC, "BalTec Forming Tools", http://www.baltecorporation.com/forming_tools.html, May 7, 2003, 2 pp.
BALTEC, "BalTec Radial Forming Technologies", http://www.baltecorporation.com/radial_forming.html, May 7, 2003, 2 pp.
BALTEC, "BalTec Riveting Machines", http://www.baltecorporation.com/riveting_machines.html, May 7, 2003, 2 pp.
BALTEC, "BalTec RN Series Riveting Machines", http://www.baltecorporation.com/m_series.html, May 7, 2003, 3 pp.

*Primary Examiner*—A. Dexter Tugbang
*Assistant Examiner*—Tai Van Nguyen
(74) *Attorney, Agent, or Firm*—Martin J. Moran

(57) ABSTRACT

A method attaches a center conductor to one or both of a load end conductor and a line end conductor. The center conductor has two cylindrical projections. The load end conductor and the line end conductor both have a non-circular opening, such as a square opening. One of the cylindrical projections of the center conductor is passed through the non-circular opening of the load end conductor. The cylindrical projection of the center conductor is deformed, in order to attach the center conductor and the load end conductor together. The other of the cylindrical projections of the center conductor is passed through the non-circular opening of the line end conductor. The load and line end conductors are aligned and the other cylindrical projection of the center conductor is deformed, in order to attach the center conductor and the line end conductor together.

13 Claims, 5 Drawing Sheets

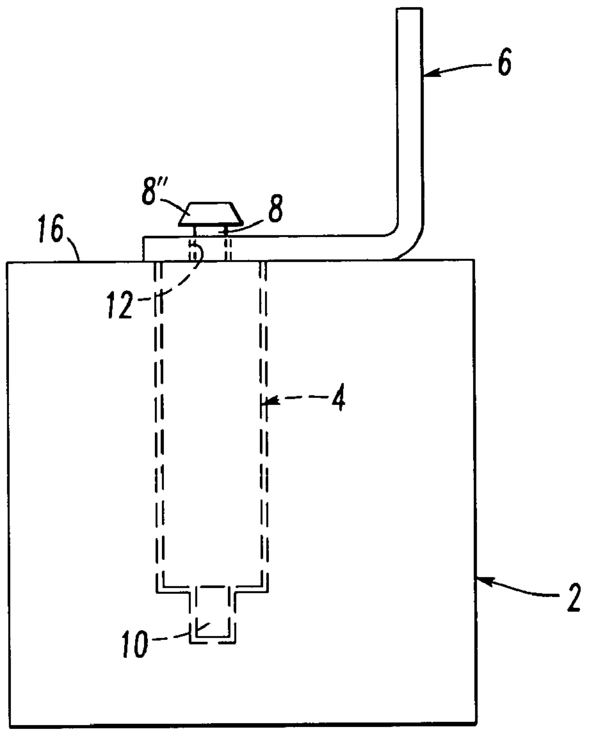
FIG.1
FIG.2
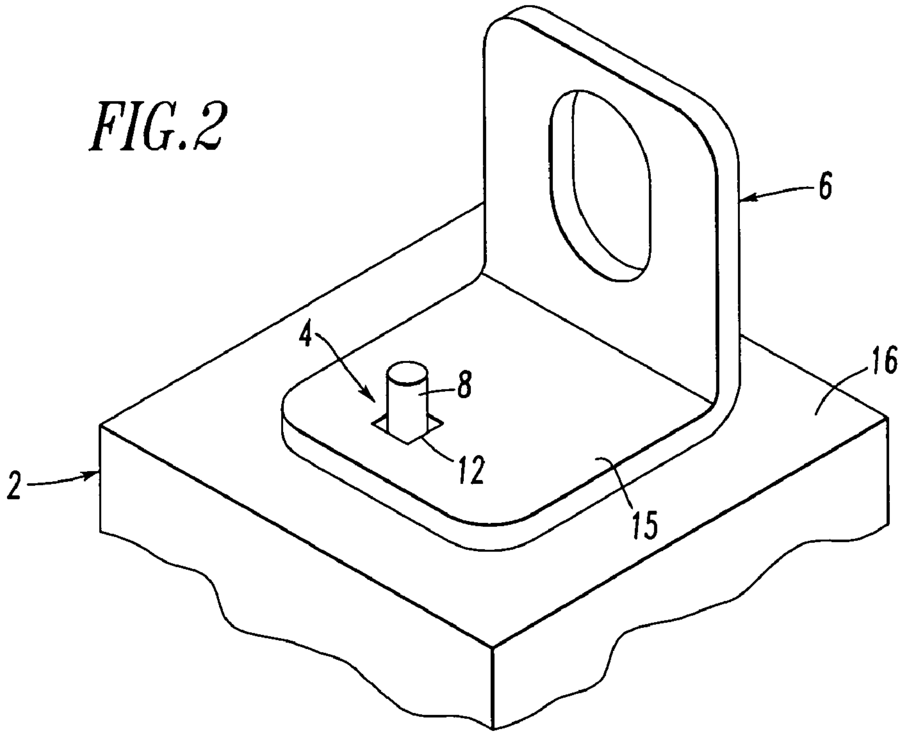

FIG. 9
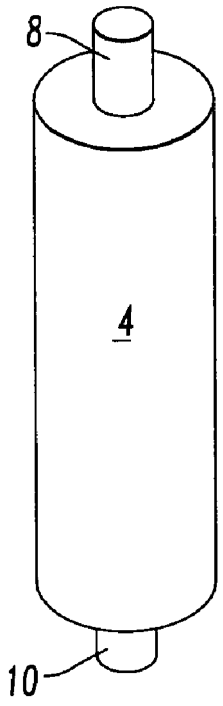
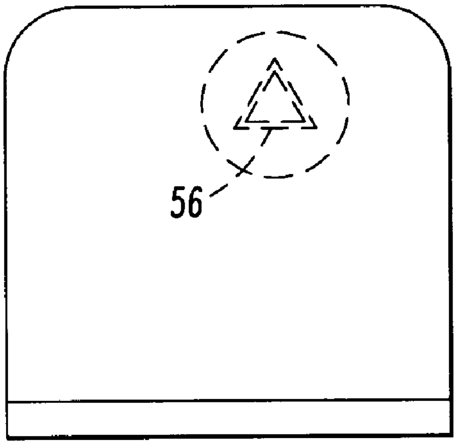
FIG. 10
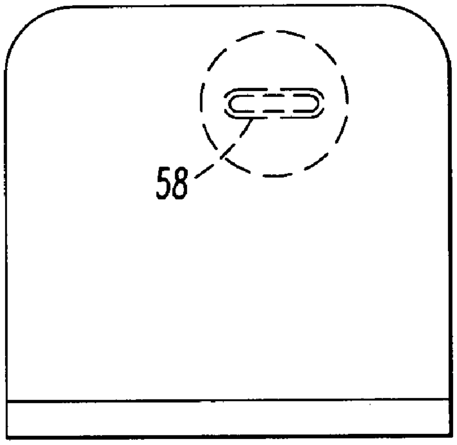
FIG. 11
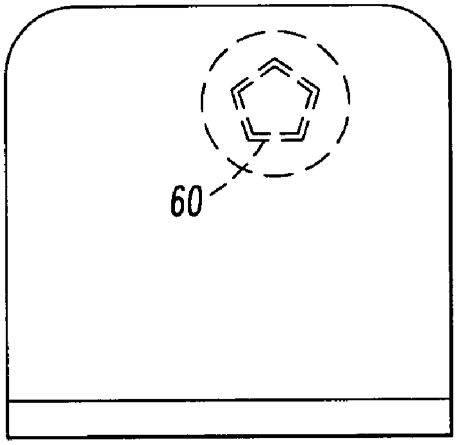
FIG. 12

METHOD FOR ATTACHING AND FOR ENSURING ORIENTATION OF COMPONENTS

BACKGROUND OF THE INVENTION

1. Field of the Invention

This invention relates to a method for attaching two or more components and, more particularly, to such a method for ensuring orientation of three attached components.

2. Background Information

During the assembly of electrical conductors, an operation known as "spinning" is frequently used. During spinning, one conductor having a cylindrical projection is fitted into a circular hole of another conductor. This is followed by a peening operation that deforms some of the protruding material, thereby joining the two conductors together.

For example, during the manufacture of current transformer assemblies for circuit breaker trip units, an assembly including a load end conductor having a circular opening, a center conductor having two cylindrical projections, a current transformer, and a line end conductor having a circular opening is assembled. The relative orientation of the load end conductor with respect to the line end conductor is critical. First, one of the cylindrical projections of the center conductor is inserted through the circular opening of the load end conductor. Next, a first spinning or peening operation deforms that first cylindrical projection of the center conductor, in order to attach the center conductor and the load end conductor together. Then, the other of the cylindrical projections of the center conductor is inserted through the circular opening of the line end conductor, and the line end conductor and the load end conductor are suitably aligned. Next, a second spinning or peening operation deforms that second cylindrical projection of the center conductor, in order to attach the center conductor and the line end conductor together. Although the line and load end conductors are initially suitably aligned, the bonds between the cylindrical projections of the center conductor and the circular openings of the line and load end conductors may break during manufacture, installation, use or repair of the trip unit. Hence, the line and load end conductors may become misaligned, thereby requiring corrective repair.

There is a need, therefore, for an improved method for attaching two or more components.

There is also a need for an improved method for ensuring orientation of three attached components.

SUMMARY OF THE INVENTION

These needs and others are satisfied by the present invention which, in order to ensure reliable attachment and accurate orientation, employs a non-circular opening (e.g., a square hole) in each of two components, such as a load end conductor and a line end conductor. These conductors maintain their relative orientations after two spinning operations with another component, such as a center conductor having two projections. Although the two projections of the center conductor are preferably cylindrical, deformed material therefrom flows into the non-circular openings (e.g., into the corners of the square holes) during the two spinning operations. When this occurs, it is virtually impossible for the orientation of the outer load end and line end conductors to change position by rotation with respect to the inner center conductor.

As an aspect of the invention, a method of attaching at least two components comprises: employing a first component having a projection; employing a second component having a non-circular opening; passing the projection of the first component through the non-circular opening of the second component; and deforming the projection of the first component passing through the non-circular opening of the second component, in order to attach the first and second components together.

The method may further comprise: employing as the projection a first cylindrical projection; employing the first component further having a second cylindrical projection; employing a third component having a non-circular opening; passing the first cylindrical projection of the first component through the non-circular opening of the second component; passing the second cylindrical projection of the first component through the non-circular opening of the third component; and deforming the second cylindrical projection of the first component passing through the non-circular opening of the third component, in order to attach the first and third components together.

The third component may be aligned with respect to the second component before deforming the second cylindrical projection of the first component, in order to maintain the alignment after deforming the second cylindrical projection of the first component.

The components may include a center conductor and a load end conductor. The center conductor may be a tellurium bearing copper bar with a hard temper.

The method may further comprise: employing as the first component a center conductor having a first cylindrical projection and an opposite second cylindrical projection; employing as the second component a load end conductor; employing as a third component a line end conductor having a non-circular opening; passing the first cylindrical projection of the center conductor through the non-circular opening of the load end conductor; deforming the first cylindrical projection of the center conductor passing through the non-circular opening of the load end conductor, in order to attach the center conductor and the load end conductor together; passing the second cylindrical projection of the center conductor through the non-circular opening of the line end conductor; and deforming the second cylindrical projection of the center conductor passing through the non-circular opening of the line end conductor, in order to attach the center conductor and the line end conductor together.

The method may further comprise: employing a current transformer having an opening; and passing the center conductor through the opening of the current transformer before passing the second cylindrical projection of the center conductor through the non-circular opening of the line end conductor. The line end conductor may be aligned with respect to the load end conductor before deforming the second cylindrical projection of the center conductor, in order to maintain the alignment after deforming the second cylindrical projection of the center conductor. A first fixture may be employed to hold the center conductor before deforming the first cylindrical projection of the center conductor passing through the non-circular opening of the load end conductor. A second fixture may be employed to hold the center conductor and the load end conductor before deforming the second cylindrical projection of the center conductor passing through the non-circular opening of the line end conductor.

BRIEF DESCRIPTION OF THE DRAWINGS

A full understanding of the invention can be gained from the following description of the preferred embodiments when read in conjunction with the accompanying drawings in which:

FIG. 1 is a side elevation view of a fixture including two conductors employed in accordance with the method of the present invention.

FIG. 2 is a top isometric view of the fixture and the conductors of FIG. 1.

FIG. 9 is an isometric view of the center conductor of FIG. 5.

FIGS. 10–12 are plan views of conductors employing non-circular openings in accordance with other embodiments of the invention.

DESCRIPTION OF THE PREFERRED EMBODIMENTS

As employed herein, the term “deforming” may be accomplished, for example, by a “spinning” and/or a “peening” and/or an upsetting and/or a riveting operation.

As employed herein, the term “spinning” means, for example, orbital forming or radial forming.

As employed herein, the term “orbital forming” means, for example, displacing material at varying rates, when examined outward from a part’s center.

As employed herein, the term “radial forming” means, for example, uniformly displacing material in three directions by kneading microscopic amounts of material radially outward, radially inward and tangentially overlapping. For example, radial forming may displace material uniformly at a constant speed, in an eleven-sided rosette pattern, in order to ensure uniform and consistent material displacement, thereby resulting in higher joint strength and superior surface finish.

As employed herein, the term “peening” means, for example, drawing, bending, impacting or flattening by, or as if by, hammering with a peen.

Figure 7:
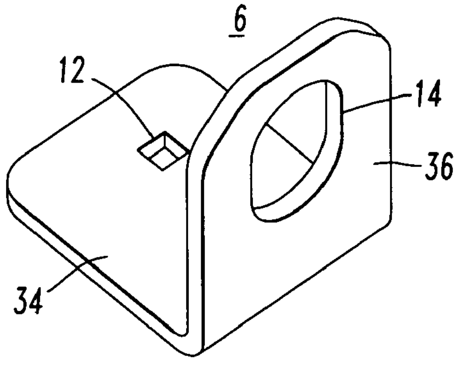
FIGS. 7 and 8 are isometric views of the L-shaped load end conductor and the line end conductor, respectively, of FIG. 5.

Referring to FIG. 1, a first fixture 2 holds a first component, such as first conductor 4 (as best shown in FIG. 9), and a second component, such as second conductor 6 (as best shown in FIG. 7). In this example, the first conductor 4 is a center conductor, which is preferably made of a tellurium bearing copper bar with a hard temper (e.g., CDA C14500-H04, CDA C14500, hard temper; UNS C14500-H 04). The first conductor 4 includes a first cylindrical projection 8 and an opposite second cylindrical projection 10. The second conductor 6 in this example is an L-shaped load end conductor and includes a non-circular opening 12 (e.g., square) and another opening 14 for a load termination of a trip unit (not shown). Although exemplary first and second conductors 4,6 are shown, the invention is applicable to the attachment of a wide range of components, which need not be conductors.

Figure 3:
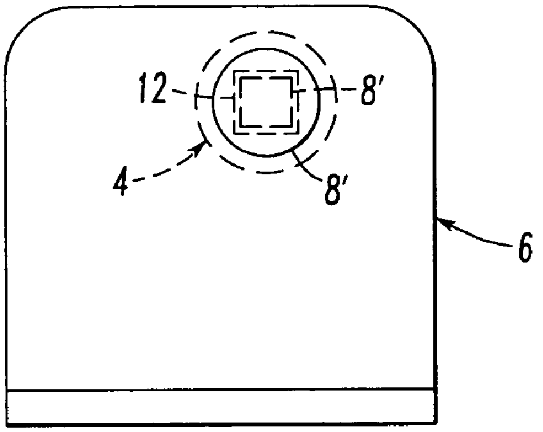
FIG. 3 is a plan view of the assembly of the two conductors of FIG. 1.

A method of attaching the center conductor 4 and the load end conductor 6 includes: employing the center conductor 4 having the first cylindrical projection 8; employing the load end conductor 6 having the non-circular opening 12; passing the cylindrical projection 8 of the center conductor 4 through the non-circular opening 12 of the load end conductor 6 (as shown in FIG. 1); and suitably deforming the cylindrical projection 8 of center conductor 4 passing through the non-circular opening 12 of the load end conductor 6, in order to attach the center conductor 4 and the load end conductor 6 together (e.g., as shown by the partially deformed cylindrical projection 8" of FIG. 1 and by the deformed cylindrical projection 8' of center conductor 4 in FIGS. 3–6). As best shown in FIG. 3, the deformed cylindrical projection 8' includes a non-circular (e.g., square) portion within the non-circular (e.g., square) opening 12 and a peened (e.g., flat circular) portion on the surface 15 of the load end conductor 6.

FIG. 2 shows the load end conductor 6 resting on the top surface 16 of the fixture 2 with the cylindrical projection 8 of center conductor 4 passing through the non-circular opening 12 of the load end conductor 6 prior to the deforming operation.

Figure 4:
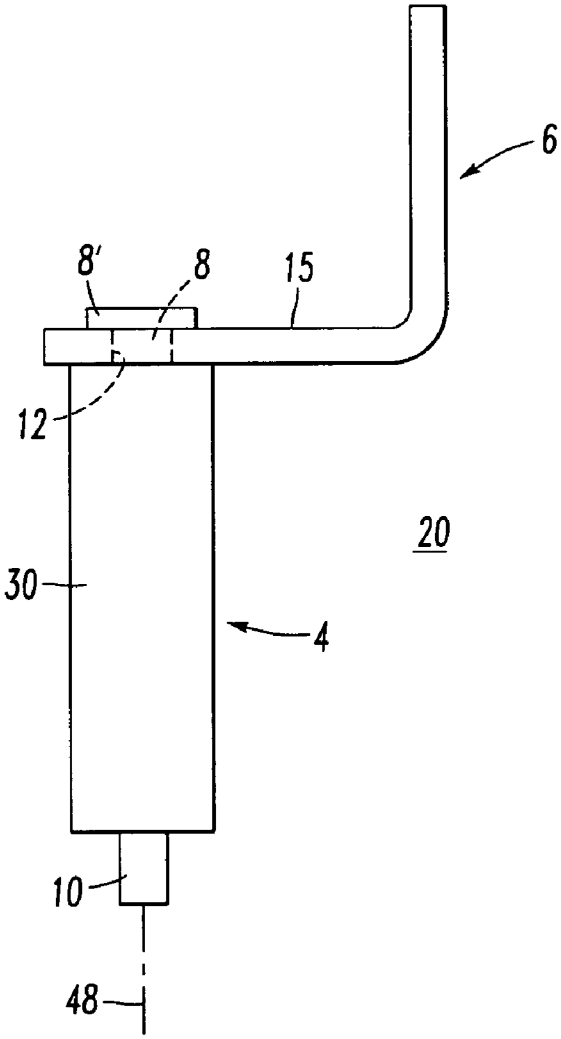
FIG. 4 is a side elevation view of the assembly of the two conductors of FIG. 1.
Figure 5:
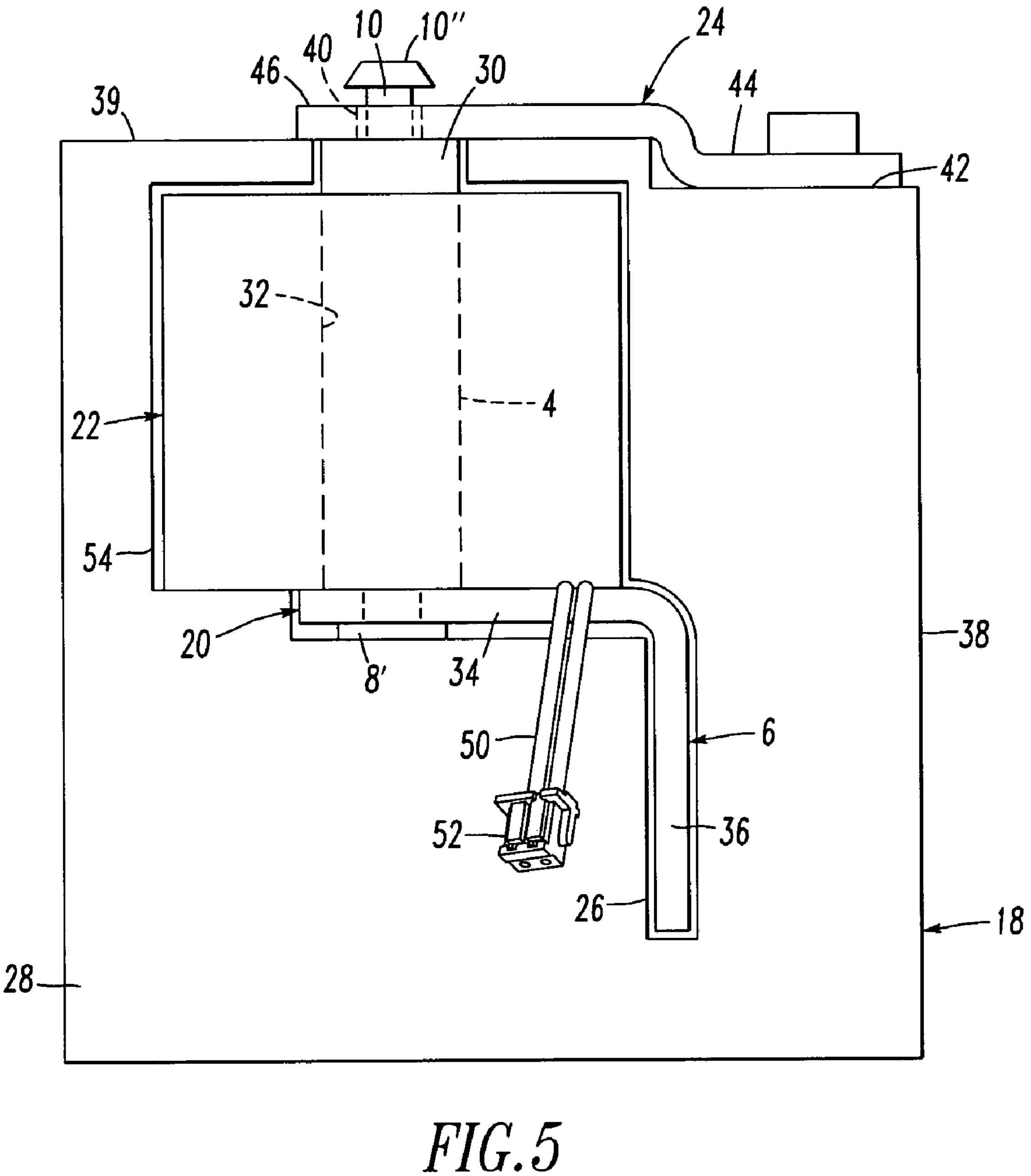
FIG. 5 is a side elevation view of a fixture including three conductors and a current transformer employed in accordance with the method of the present invention.
Figure 8:
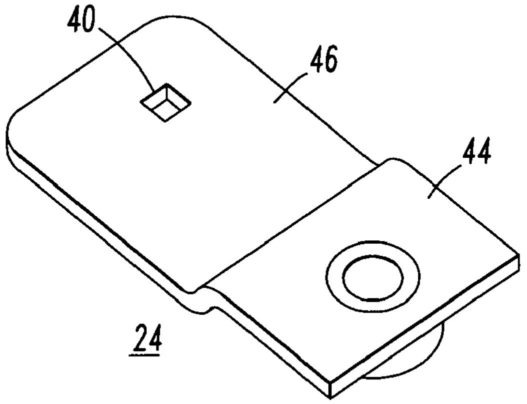

Referring to FIG. 5, a second fixture 18 holds a subassembly, such as the assembly 20 of FIG. 4, a current transformer 22 and a line side conductor 24 (as best shown in FIG. 8). The assembly 20 was assembled as discussed above in connection with FIG. 1. The fixture 18 includes a cavity 26 in the side 28 thereof, which cavity accepts the assembly 20 and the current transformer 22. The center cylindrical portion 30 of the center conductor 4 (FIG. 4) passes through the central opening 32 (shown in hidden line drawing) of the current transformer 22 before the assembly 20 and the current transformer 22 are positioned within the cavity 26. Preferably, the cavity 26 is suitably sized in order that the assembly 20, in general, and the first leg 34 of the L-shaped load side conductor 6, in particular, are fixed in relation to the fixture 18. For example, the second leg 36 of the L-shaped load side conductor 6 is parallel to the side 38 of the fixture 18, while the first leg 34 is normal to that side 38 and is parallel with respect to the top 39 of the fixture 18.

Prior to performing a deforming operation on the second cylindrical projection 10 of the center conductor 4, the line side conductor 24 is positioned on the top 39 of the fixture 18, with the cylindrical projection 10 passing through the non-circular (e.g., square) opening 40 (as best shown in FIG. 8) of the line side conductor 24. Preferably, the fixture 18 includes a recess 42, which is suitably sized in order that the line side conductor 24 is fixed in relation to the fixture 18. For example, the recess 42 may be sized to hold the portion 44 of the conductor 24 normal to the side 38 and parallel with respect to the top 39 of the fixture 18. Furthermore, this results in the portion 46 of the conductor 24 being parallel to the first leg 34 of the L-shaped conductor 6 and being disposed at the same angle of rotation about the central axis 48 (FIG. 4) of the center conductor 4.

Figure 6:
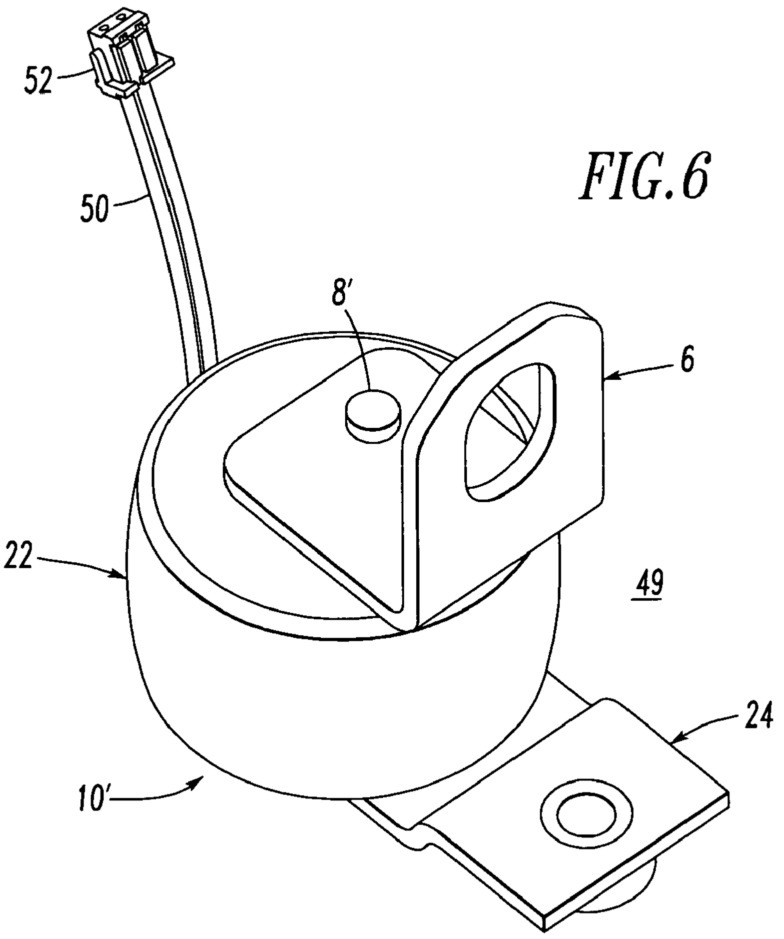
FIG. 6 is an isometric view of the assembly of the current transformer and the three conductors of FIG. 5.

After this alignment is performed by the fixture 18, the cylindrical projection 10 of center conductor 4 passing through the non-circular opening 40 of the line end conductor 24 is suitably deformed as shown by the partially deformed cylindrical projection 10' of FIG. 5, in order to attach the center conductor 4 and the line end conductor 24 together. This results in the completed assembly 49 of FIG. 6, in which the deformed cylindrical projection 10' of center conductor 4 is essentially the same as the deformed cylindrical projection 8' of FIGS. 3–6. As shown in FIG. 6, the current transformer 22 includes a pair of wires 50 and a connector 52. During assembly, the wires 50 and the connector 52 pass through the opening 54 of the side 28 of the fixture 18.

As was indicated above, the line end conductor 24 is preferably aligned with respect to the load end conductor 6 before deforming the second cylindrical projection 10 of the center conductor 4, in order to maintain that alignment after the second deforming step. The first fixture 2 is employed to advantageously hold the center conductor 4 before deforming the first cylindrical projection 8 passing through the non-circular opening 12 of the load end conductor 6. The second fixture 18 is advantageously employed to hold the center conductor 4, the load end conductor 6 and the line end conductor 24 before deforming the second cylindrical projection 10 passing through the non-circular opening 40 of the line end conductor 24. Preferably, the conductors 6,24 are made of a suitable conductor, such as copper.

As shown in FIGS. 7 and 8, the square holes 12 and 40 of the L-shaped load end conductor 6 and the line end conductor 24, respectively, ensure, after the alignment and deforming operations, as was discussed above in connection with FIGS. 1 and 5, the relative orientation of those conductors 6,24 in a trip unit (not shown). The two deforming operations may include one or both of a spinning operation and/or a peening operation. As shown in FIGS. 3 and 4, such operation preferably forms a flat circular surface on the deformed cylindrical projection 8', with material of the cylindrical projection 8 flowing into the four corners of the square opening 12 after the deforming operation. Such a deforming operation may be provided by, for example, a BRACKER™ spinner, such as an RN Series riveting machine, marketed by BalTec, formerly known as The Bracker Corporation, of Canonsburg, Pa., in order to suitably deform the cylindrical projections 8,10 of the exemplary copper center conductor 4. Although a generally flat surface of the deformed cylindrical projection 8' is shown in FIGS. 3 and 4, a wide range of other deformed forms (e.g., conical) may be provided.

Although conductors 6,24 having square openings 12,40 are shown in FIGS. 7 and 8, any suitable non-circular opening (e.g., formed from straight and/or arcuate segments) may be employed. For example, a pear-shaped opening (not shown), a triangular opening 56 (FIG. 10), an elliptical opening 58 (as shown overly elongated for purposes of illustration in FIG. 11), or openings having four or more sides, such as the five-sided opening 60 of FIG. 12, may be employed. All of these non-circular openings function to resist rotation of deformed cylindrical projections, such as 8',10' of the exemplary copper center conductor 4.

Although exemplary conductors 4,6,24 and the current transformer 22 are shown, the invention is applicable to a wide range of such conductors and components, in order to support a wide range of trips units (not shown) for a wide range of circuit breaker frame sizes.

Although a cylindrical projection 8 is disclosed, it will be appreciated that a wide range of suitable projections (e.g., a substantially cylindrical projection; a projection having a suitable non-circular cross-section) may be employed.

The invention is further applicable to any application in which one or more conductor ends, or in which one or more mechanical attachment ends, are spun over or suitably deformed in a non-circular opening in order to ensure the relative orientation of two or more such components.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of attaching at least two components comprising:

employing a first component having a projection;

employing a second component having a non-circular opening;

passing the projection of said first component through the non-circular opening of said second component;

deforming the projection of said first component passing through the non-circular opening of said second component, in order to attach said first and second components together; and employing electrical conductors as said first and second components.

2. A method of attaching at least two components comprising:

employing a first component having a projection;

employing a second component having a non-circular opening;

passing the projection of said first component through the non-circular opening of said second component;

deforming the projection of said first component passing through the non-circular opening of said second component, in order to attach said first and second components together;

employing three components as said at least two components;

employing as said projection a first cylindrical projection;

employing said first component further having a second cylindrical projection;

employing a third component having a non-circular opening;

passing the first cylindrical projection of said first component through the non-circular opening of said second component;

passing the second cylindrical projection of said first component through the non-circular opening of said third component; and deforming the second cylindrical projection of said first component passing through the non-circular opening of said third component, in order to attach said first and third components together.

3. The method of claim 2 further comprising:

aligning said third component with respect to said second component before said deforming the second cylindrical projection of said first component, in order to maintain said alignment after said deforming the second cylindrical projection of said first component.

4. A method of attaching at least two components comprising:

employing a first component having a projection;

employing a second component having a non-circular opening;

passing the projection of said first component through the non-circular opening of said second component;

deforming the projection of said first component passing through the non-circular opening of said second component, in order to attach said first and second components together; and employing as said at least two components a center conductor and a load end conductor.

5. The method of claim 4 further comprising:

employing as said center conductor a tellurium bearing copper bar with a hard temper.

6. A method of attaching at least two components comprising:

employing a first component having a projection;

employing a second component having a non-circular opening;

passing the projection of said first component through the non-circular opening of said second component;

deforming the projection of said first component passing through the non-circular opening of said second component, in order to attach said first and second components together;

employing as said first component a center conductor having a first cylindrical projection and an opposite second cylindrical projection;

employing as said second component a load end conductor;

employing as a third component a line end conductor having a non-circular opening;

passing the first cylindrical projection of said center conductor through the non-circular opening of said load end conductor;

deforming the first cylindrical projection of said center conductor passing through the non-circular opening of said load end conductor, in order to attach said center conductor and said load end conductor together;

passing the second cylindrical projection of said center conductor through the non-circular opening of said line end conductor; and deforming the second cylindrical projection of said center conductor passing through the non-circular opening of said line end conductor, in order to attach said center conductor and said line end conductor together.

7. The method of claim 6 further comprising:

employing a current transformer having an opening; and passing said center conductor through the opening of said current transformer before passing the second cylindrical projection of said center conductor through the non-circular opening of said line end conductor.

8. The method of claim 6 further comprising:

aligning said line end conductor with respect to said load end conductor before said deforming the second cylindrical projection of said center conductor, in order to maintain said alignment after said deforming the second cylindrical projection of said center conductor.

9. The method of claim 6 further comprising:

employing a first fixture to hold said center conductor before said deforming the first cylindrical projection of said center conductor passing through the non-circular opening of said load end conductor; and employing a second fixture to hold said center conductor and said load end conductor before said deforming the second cylindrical projection of said center conductor passing through the non-circular opening of said line end conductor.

10. The method of claim 9 further comprising:

employing the second fixture to align said line end conductor with respect to said load end conductor before deforming said second cylindrical projection.

11. A method of attaching at least two components comprising:

employing a first component having a projection;

employing a second component having a non-circular opening;

passing the projection of said first component through the non-circular opening of said second component;

deforming the projection of said first component passing through the non-circular opening of said second component, in order to attach said first and second components together; and employing as said deforming one of a spinning operation and a peening operation.

12. The method of claim 11 further comprising:

employing a cylindrical projection as said projection of said first component; and forming a flat surface on said cylindrical projection of said first component during said deforming.

13. A method of attaching at least two components comprising:

employing a first component having a projection;

employing a second component having a non-circular opening;

passing the projection of said first component through the non-circular opening of said second component;

deforming the projection of said first component passing through the non-circular opening of said second component, in order to attach said first and second components together; and employing as said non-circular opening an elliptical opening.

* * * * *